US006150753A

United States Patent [19]

DeCastro

[11] Patent Number: 6,150,753

[45] Date of Patent: Nov. 21, 2000

[54] ULTRASONIC TRANSDUCER ASSEMBLY HAVING A COBALT-BASE ALLOY HOUSING

[75] Inventor: Eugene A. DeCastro, Jamestown, N.Y.

[73] Assignee: Cae Blackstone, Jamestown, N.Y.

[21] Appl. No.: 08/990,437

[22] Filed: Dec. 15, 1997

[51] Int. Cl.[7] .................................................... H01L 41/08

[52] U.S. Cl. ............................................ 310/334; 310/325

[58] Field of Search .................................... 310/325, 323, 310/334–337; 366/108, 127, 113–115; 134/1, 184

[56] References Cited

U.S. PATENT DOCUMENTS

| | | | |
|---|---|---|---|
| 3,094,314 | 6/1963 | Kearney et al. | 310/334 X |
| 3,113,761 | 12/1963 | Platzman | 310/334 X |
| 3,318,578 | 5/1967 | Branson | 310/334 X |
| 3,329,408 | 7/1967 | Branson | 310/334 X |
| 5,119,840 | 6/1992 | Shibata | 310/337 X |

OTHER PUBLICATIONS

The Effect of Composition and Microstructure on Cavitation Erosion Resistance, K.C. Antony and W.L. Silence, Proc. 5th Intl. Conf. on Erosion by Solid and Liquid Impact, (Date unknown).

ULTIMET alloy, published by Haynes International producer of ULTIMET alloy, 1994.

ULTIMET product, published by Haynes International, Mar. 8, 1995.

ASTM Standard Test Method for Cavitation Erosion using Vibratory Apparatus, Designation G 32–92, Jul. 1992.

Correlation of cavitation erosion behavior with mechanical properties of metals, R.H. Richman and W.P. McNaughton, Elsevier Sequoia, 1990.

Practical Guide to Wear for Corrosion Engineers, Paul Crook, 1991, Materials Performance.

Cavitation Erosion, A. Thiruvengadam, Applied Mechanics Reviews (Date unknown).

*Primary Examiner*—Mark O. Budd
*Attorney, Agent, or Firm*—The Bilicki Law Firm, P.C.

[57] ABSTRACT

An ultrasonic transducer assembly, having a cobalt-base alloy housing with at least one planar wall section, and at least one ultrasonic transducer mounted to the planar wall section, the ultrasonic transducer operatively arranged to impart an ultrasonic vibrating force to the planar wall section of the housing.

8 Claims, 5 Drawing Sheets

FIG. 1
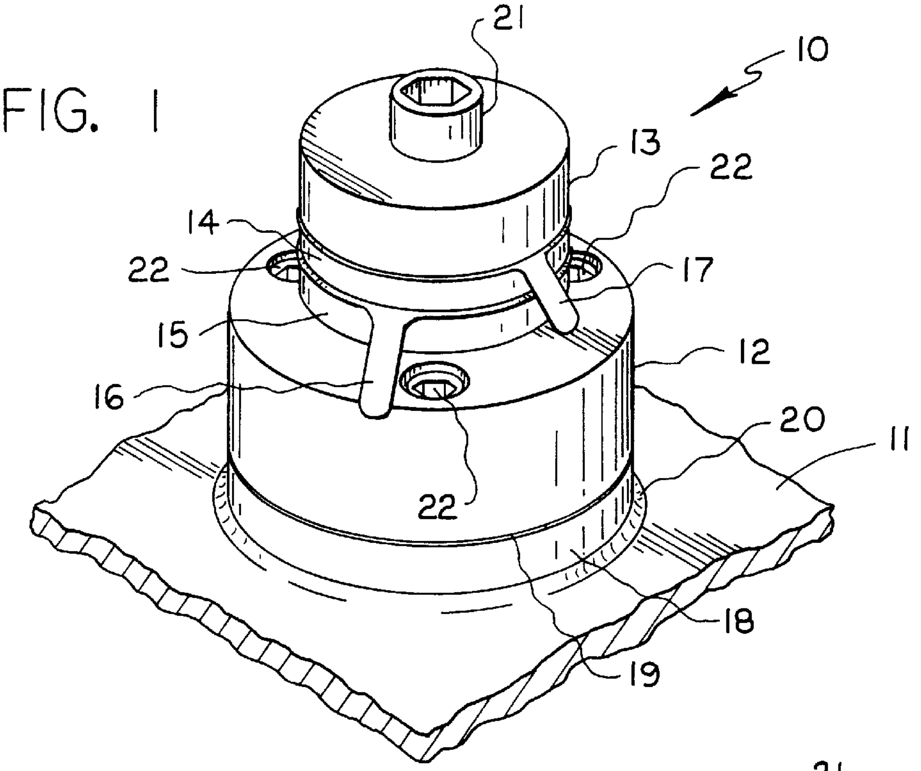
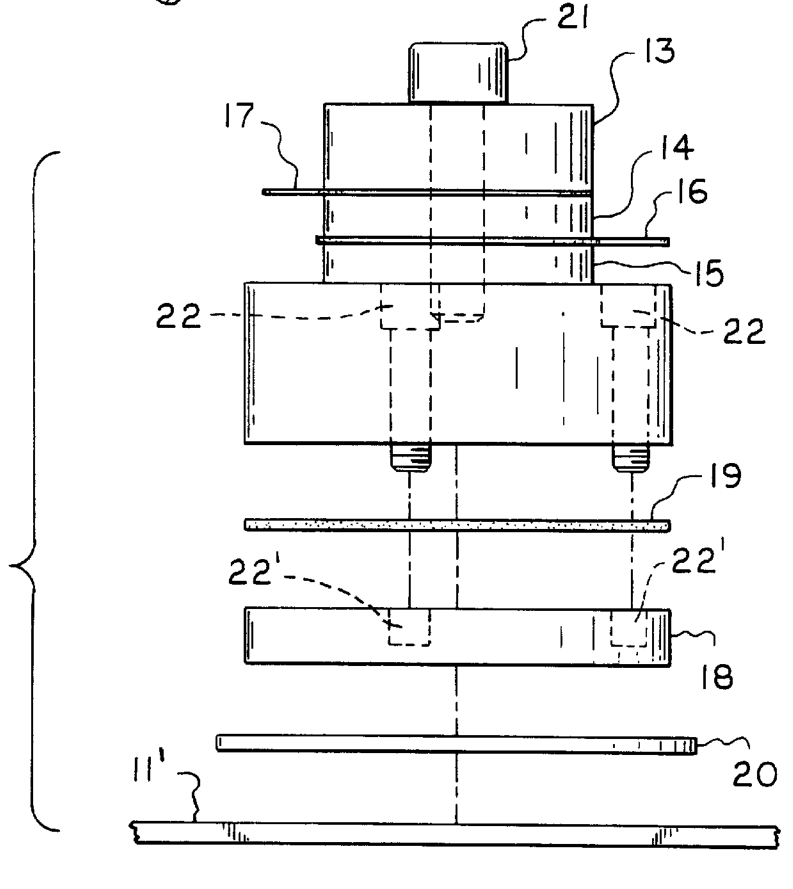
FIG. 2
PRIOR ART

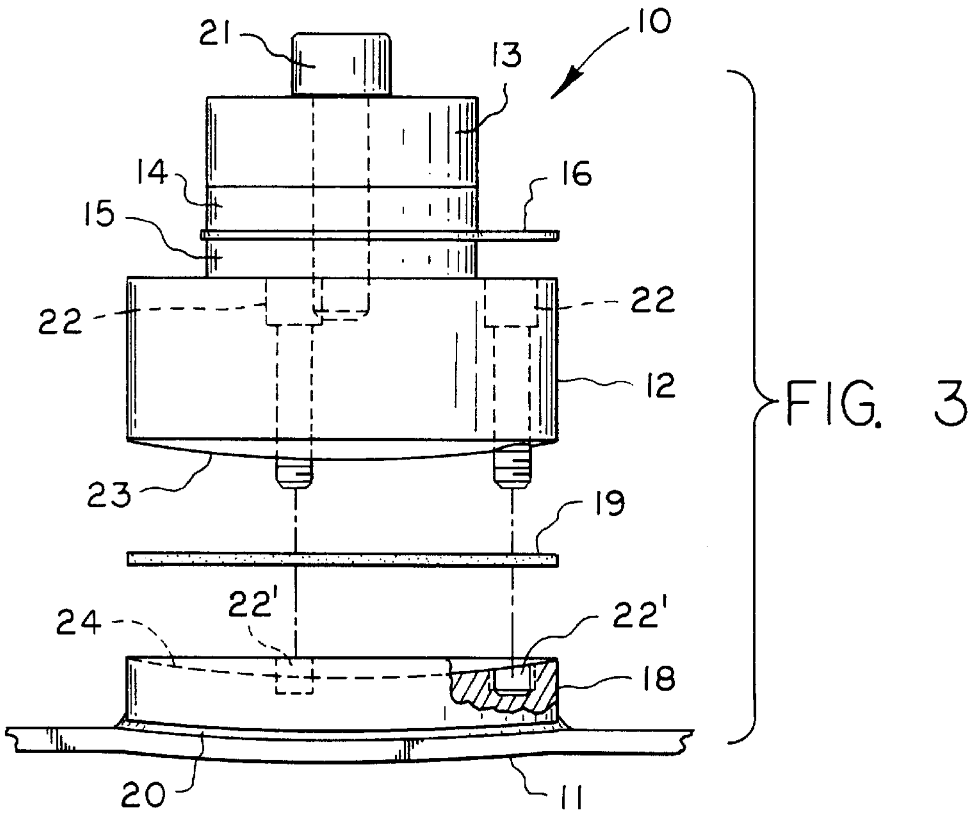
FIG. 3
FIG. 5
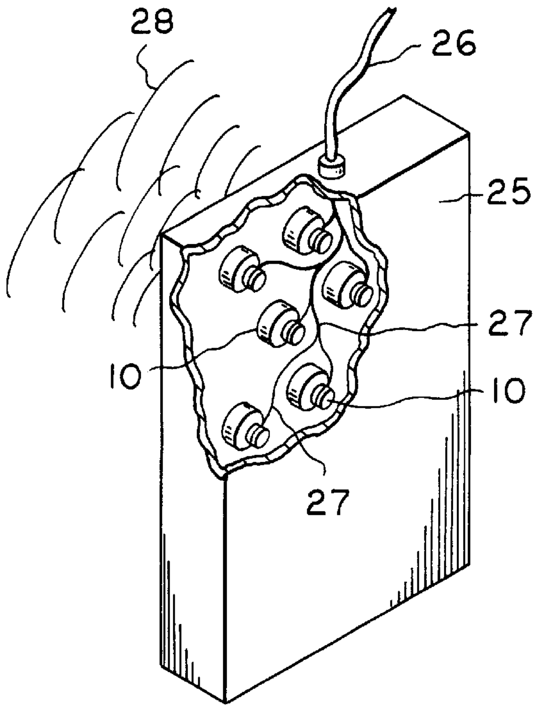
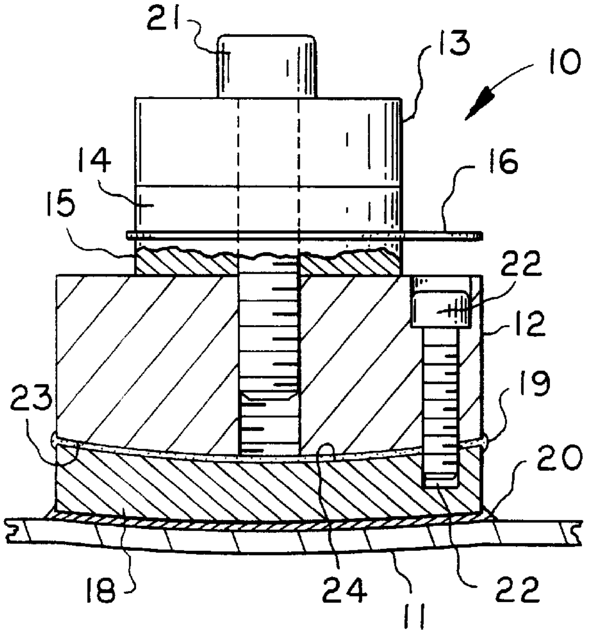
FIG. 4

ULTRASONIC TRANSDUCER ASSEMBLY HAVING A COBALT-BASE ALLOY HOUSING

FIELD OF THE INVENTION

This invention relates generally to ultrasonic cleaning, more particularly to ultrasonic transducer assemblies, and, more specifically, to an ultrasonic transducer assembly having a cobalt-base alloy housing.

BACKGROUND OF THE INVENTION

Cleaning is critical to most manufacturing processes. Solvents, which had long been considered the "ultimate" cleaners, are being largely eliminated from the arsenal of available cleaning tools in a world-wide environmental effort. Aqueous and semi-aqueous cleaners are the only viable options left for many applications. Ultrasonic excitation boosts the effectiveness of aqueous and semi-aqueous cleaners to exceed the quality and cost standards previously obtained by the use of solvents. Ultrasonic methods provide the ultimate in cleaning effectiveness and speed to satisfy the needs of the changing environmentally-sensitive manufacturing world.

Ultrasonic energy has the ability to reach inside partially closed areas such as part interiors, blind holes and crevices to give a mechanical boost to chemical cleaning where the use of a brush or other means is either impossible, ineffective, or time consuming. On a macro scale, this may include cleaning the interior or a transmission housing weighing several hundred pounds or on a micro scale, removing buffing compound residue from filigree work on expensive jewelry. The thoroughness of ultrasonic cleaning cannot be matched by any other method.

In ultrasonic cleaning, a solid state electronic generator converts standard electrical current into electrical energy of a higher frequency (typically 10–200 KHz). A transducer then converts this energy into mechanical waves. These transducers are either bonded to the exterior wall of a tank, or are enclosed in a stainless steel immersible housing which is mounted inside a tank. The sound waves produced by these transducers cause disruption of the liquid as alternative positive and negative pressure areas are produced resulting in vacuum cavities or cavitation bubbles. These bubbles are created during negative pressure periods, grow larger over several cycles and then collapse. The pressure exerted by the imploding bubbles accomplishes a scrubbing action which results in rapid, efficient and gentle cleaning. The small size of the bubbles permits their penetration into areas that cannot be reached using brushes or sprays.

There are several problems associated with manufacturing an effective ultrasonic cleaning apparatus. In some applications, the cleaning fluid is corrosive. This requires that the ultrasonic cleaning tank be made of a compatible corrosion-resistant material, such as stainless steel, quartz or a more exotic material for certain acids. It also is imperative that the transducer be properly coupled to the liquid so that the ultrasonic energy is effectively transferred from the transducer to the liquid in the tank. A preferred method of attachment of the transducer element to the exterior wall of the tank or to the immersible housing is vacuum brazing. Since vacuum brazing is best accomplished between two similar metals, transducers have, in the past, been secured to a stainless steel brazing mass (by epoxy, for example) and the brazing mass was brazed to the wall of the tank. A preferred method is that of vacuum brazing.

Another problem encountered by manufacturers of ultrasonic cleaning equipment is that of cavitation erosion.

Cavitation at the liquid-solid surface boundary has been the subject of many articles. The two mechanisms thought to be responsible near the surface are microjet impact and shock wave damage. At the interface boundary, deformation of the collapsing cavitation bubble induces a fast-moving stream of liquid toward the surface with velocities greater than 100 meters/second. Surface pitting is the result of these microscopic impacts. Shock waves created by the collapsing cavity are also produced. One estimate of the peak pressures created is 500 atmospheres, which is half the pressure at the deepest region of the ocean, the Mariana Trench. Both mechanisms are known to exist, but the relative importance of each is a matter of debate. These mechanisms are responsible for cleaning. The effects of microjet streaming and shock waves expose, by breaking through the surface boundary layer, the base surface of the materials being cleaned.

The materials of which the ultrasonic tank are made are attacked at the point of maximum vibration by these same mechanisms over long hours of operation. To prevent cavitation damage, surface coatings such as hard chrome and titanium nitride have been used in the industry for many years. These materials reduce cavitation erosion which is considered to be a mechanical mechanism, by increasing the surface hardness. A 2 mil hard chrome coating has a Rockwell C hardness of 60, as compared to 25 for 316L stainless steel. Endurance testing has shown a reduction in surface cavitation erosion by a factor of 10.

In certain industries, the release of certain metals into the cleaning media due to even very mild cavitation erosion is very harmful. For instance, chromium will attack the silicon substrate used to manufacture semiconductors.

A new cobalt-base alloy has demonstrated resistance to cavitation erosion and corrosion. This alloy, sold under the trademark ULTIMET® by Haynes International, Inc. of Kokomo, Ind., demonstrates high elastic resilience, high yield strength and phase transformations. The alloy also demonstrates high resistance to cyclic fatigue. Surprisingly, despite the known features of this new alloy, no one has as yet used this alloy in a housing of an ultrasonic cleaning apparatus. Perhaps one reason for this is the high cost of the alloy. Perhaps another reason is that no one has heretofore discovered how to vacuum braze a stainless steel brazing element to the cobalt-base alloy wall (since it is cost prohibitive to construct the brazing disk from cobalt-base alloy as well). Unfortunately, manufacturing an ultrasonic cleaning apparatus having a tank constructed of one material and brazing member constructed of another dissimilar material creates problems that must be solved Copper or other metallic vacuum brazing requires that the parts to be brazed be slowly heated in a vacuum chamber to 2000° F. at which point the copper melts and surface tension holds the parts closely together. With dissimilar materials being brazed, one of the materials will have expanded more or less than the other. As the parts are cooled, the copper solidifies joining the parts together but as additional cooling occurs the parts are under considerable stress due to the difference in thermal expansion of the parts. This results in a distortion of the parts and typically a concave shape on the stainless steel brazing mass and a convex shape to the outer cobalt-base alloy material. In summary, welding of the two dissimilar metals does not provide optimum coupling. Vacuum brazing is preferred but difficult to achieve.

What is needed, then, is an ultrasonic transducer assembly having a cobalt-base alloy housing, and a means to compensate for the distortion of the parts during the production process.

SUMMARY OF THE INVENTION

The present invention broadly comprises an ultrasonic transducer assembly, having a cobalt-base alloy housing with at least one planar wall section, and at least one ultrasonic transducer mounted to the planar wall section, the ultrasonic transducer operatively arranged to impart an ultrasonic vibrating force to the planar wall section of the housing. In a preferred embodiment, the ultrasonic transducer comprises piezoelectric crystals sandwiched between two alloy members.

A primary object of the present invention is to provide an ultrasonic transducer assembly that is durable in a corrosive environment, having a cobalt-base alloy housing.

A secondary object of the present invention is to provide an ultrasonic transducer assembly comprising one or more ultrasonic transducers secured by vacuum brazing to a cobalt-base alloy housing.

These and other objects, features and advantages of the present invention will become readily apparent to one having ordinary skill in the art from the following specification, claims and appended drawings.

BRIEF DESCRIPTION OF THE DRAWINGS

FIG. 1 is a perspective view of the transducer assembly of the present invention;

FIG. 2 is a front exploded view of a prior art ultrasonic transducer assembly;

FIG. 3, is a front exploded view of the ultrasonic transducer assembly shown in FIG. 1;

FIG. 4 is a front fragmentary cross-sectional view of the ultrasonic transducer assembly shown in FIG. 1;

FIG. 5 illustrates a plurality of the ultrasonic transducers of the present invention mounted within an immersible housing;

DETAILED DESCRIPTION OF THE PREFERRED EMBODIMENT

Figure 6:
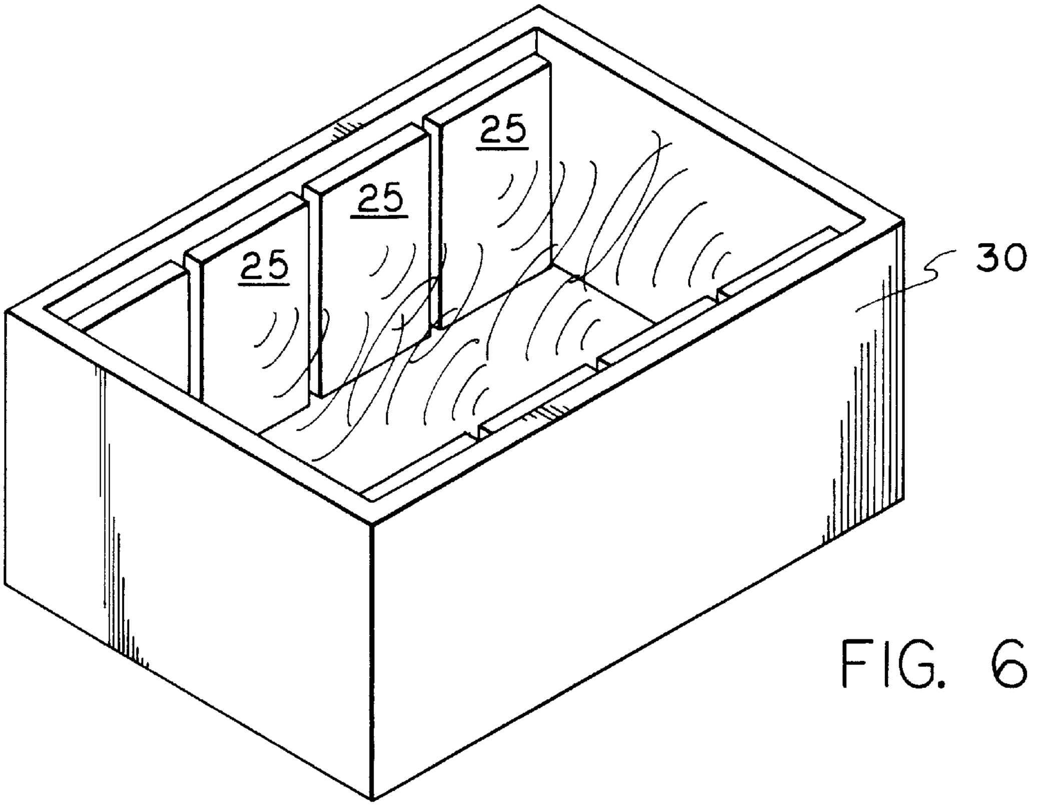
FIG. 6 illustrates a plurality of the housings shown in FIG. 5 mounted within an ultrasonic cleaning tank.

At the outset it should be understood that like reference numerals on various drawing figures refer to identical structural elements.

Adverting first to FIG. 1, the ultrasonic transducer assembly is seen to include at least one ultrasonic transducer 10 mounted to a cobalt-base alloy wall 11 of a housing. Transducer 10 comprises first transducer member 13, second transducer member 12, a pair of piezoelectric crystals 14 and 15 positioned atop one another and sandwiched between the first and second transducer members, a first electrode 16 electrically connected to said crystals, and a second electrode 17 electrically connected to said crystals. The crystals are connected to a source of electrical energy which causes them to vibrate at a predetermined frequency as is well known in the art. Typically, the crystals are caused to vibrate at frequencies in the range of 20–170 KHz. When an appropriate voltage is applied across the electrodes, the crystals impart an ultrasonic vibrating force to the first and second transducer members, which force is then imparted to wall 11.

In a preferred embodiment of the present invention, wall 11 is comprised of a cobalt-base alloy. Specifically, the inventors have achieved optimum results by manufacturing the housing from ULTIMET® brand alloy, available from Haynes International, Inc. of Kokomo, Ind. ULTIMET® is a cobalt-chromium alloy having a nominal chemical composition (weight percent) as follows: cobalt (54%), chromium (26%), nickel (9%), molybdenum (5%), tungsten (2%), and iron (3%). The alloy also contains trace amounts (less than 1% weight percent) of manganese, silicon, nitrogen and carbon. Although the manufacturer of ULTIMET® advertises that the alloy is an ideal welding material, it is not advisable to weld the transducer to the wall of the housing in the present invention, because welding does not provide optimum coupling of the transducer to the wall.

As is known in the art and illustrated in FIG. 2, a preferred method of manufacture of ultrasonic transducer assemblies involves mounting of the transducers to the housing by vacuum brazing. FIG. 2 illustrates in exploded view how a prior art transducer is vacuum brazed to a stainless steel wall 11' of a transducer assembly wall. As shown in the drawing, second transducer member 12 is mounted to brazing element 18 by bolts 22 which engage threaded partial through-bores 22'. The element is further secured to brazing member 18 by a layer of epoxy 19. The brazing element is typically made of stainless steel, and is vacuum brazed to stainless steel wall 11' using brazed material 20. This method of securing the transducer to the wall of a transducer assembly achieves optimum coupling of the transducer to the wall. Unfortunately, this prior art assembly method does not work when the wall is constructed of a dissimilar metal with respect to the brazing member. Specifically, during the brazing process, in achieving an effective braze, brazing member 18 becomes deformed during the process resulting in a poor coupling between second member 12 and brazing member 18. This is shown more clearly in FIG. 3.

FIG. 3 illustrates, in exploded view, the present invention. In this embodiment brazing member 18 is brazed to cobalt alloy wall 11. During the brazing process the upper surface 24 becomes deformed as illustrated by dotted line in the drawing. Specifically, surface 24 becomes concave as a result of deformation during brazing. The actual deformation is exaggerated in FIG. 3. As a result of this deformation during brazing, second member 12 of transducer 10 does not perfectly mate with brazing member 18 to form an effective coupling. To overcome this problem, the inventor has found that is necessary to machine a convex exterior surface 23 into second member 12. After brazing, the convex surface 23 mates precisely with concave surface 24 of brazing member 18 resulting in an effective coupling between the transducer and the brazing member. This coupling is best illustrated in FIG. 4 which shows in fragmentary cross-sectional view the transducer as it has been brazed to the wall of the transducer assembly.

An alternative technique to overcome this problem is to pre-machine a convex shape on the top surface of brazing element 18 so that a flat surface results following member 18 being brazed to plate 11.

FIG. 5 illustrates a plurality of transducers 10 brazed to a wall of an enclosure of a housing 25. Also shown in the drawings is electrical cable 26 which is used to transmit electrical energy to the individual transducers via leads 27. Also shown schematically in the drawing are ultrasonic waves 28 produced by the plurality of the transducers which transmit ultrasonic energy to the wall of the enclosure.

FIG. 6 illustrates another embodiment of the ultrasonic transducer assembly. In this embodiment a plurality of enclosures 25 (as shown in FIG. 5) are mounted to the interior walls of a larger enclosure 30. Articles to be ultrasonically cleaned would be placed in the housing 30 and immersed in solution.

Figure 7:
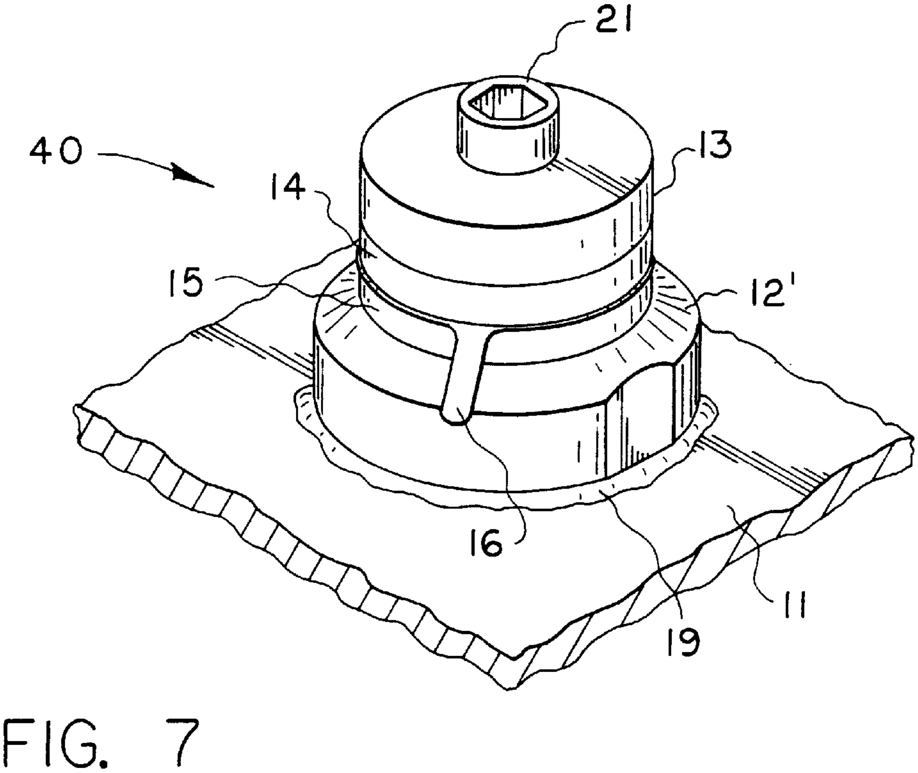
FIG. 7 illustrates an alternative embodiment of the present invention.

FIG. 7 illustrates in perspective view an alternative embodiment of the present invention. In this embodiment, transducer 40 threadably engages a stud on cobalt alloy wall 11. The transducer is further secured to the wall by a layer of epoxy. This mounting assembly is best illustrated in FIG. 8 which shows in exploded view how transducer 40 threadably engages stud 31 which protrudes from wall 11 and is further secured by epoxy layer 19.

Figure 8:
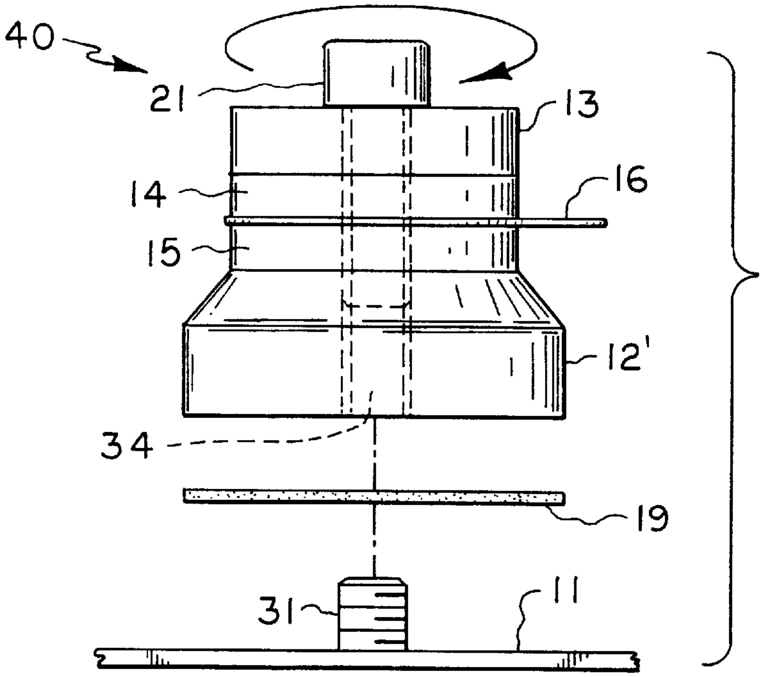
FIG. 8 is a front exploded view of the embodiment of the invention shown in FIG. 7; and, FIG. 9 illustrates a plurality of the transducers shown in FIG. 7 secured to the exterior bottom wall of an ultrasonic cleaning tank.
Figure 9:
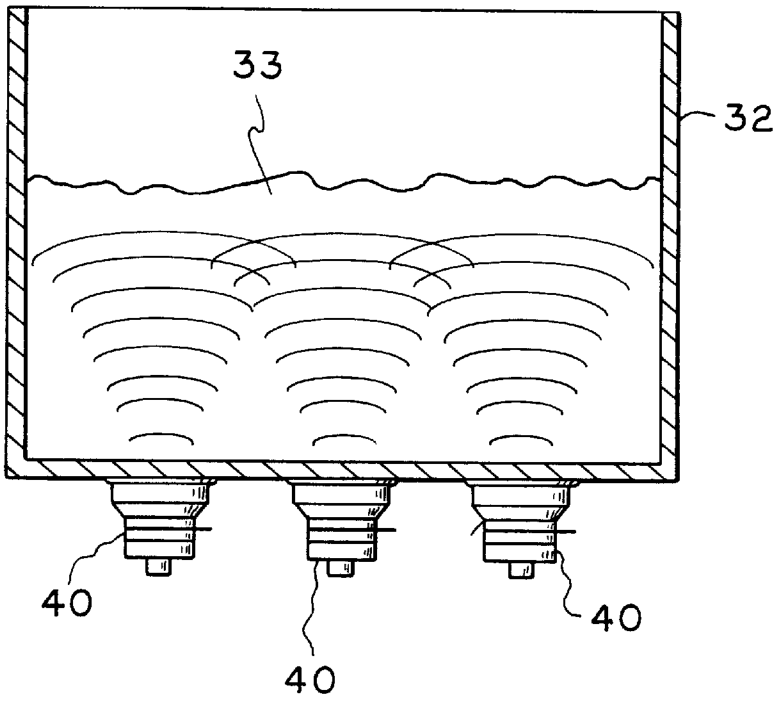

FIG. 9 illustrates an application which uses transducer assembly 40 shown in FIG. 8. In this application a plurality of transducers 40 are secured to the bottom wall of housing 32. Ultrasonic vibrations produced by the transducers are transmitted through the bottom wall and into the fluid medium 33.

Figure 10:
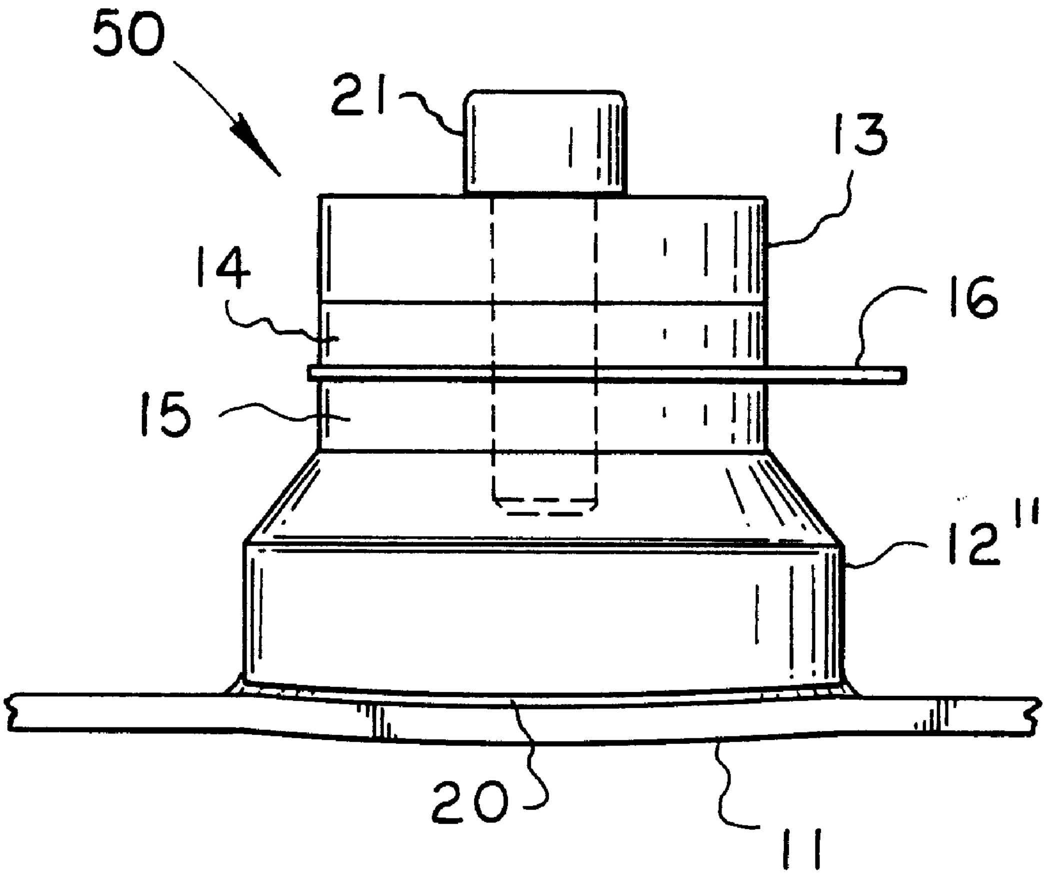
FIG. 10 illustrates yet another embodiment of the invention where the second transducer member is secured to the wall of the housing directly, either by vacuum brazing or epoxy.

FIG. 10 illustrates yet another embodiment 50 of the invention. In this embodiment, the second transducer member is secured to the wall of the housing directly, either by epoxy or vacuum brazing (vacuum brazing is illustrated in the drawing). In this embodiment, the bottom surface of the second transducer member is machined to form a convex shape as discussed supra. After brazing the bottom surface of the second member and the wall create a high integrity acoustic coupling.

It should be noted that alternative configurations of the transducer are possible, as are methods of securing the transducer to the wall of the housing, without departing from the spirit of the invention. For example, first transducer element 13 may be comprised of cold-rolled steel, aluminum, brass, stainless steel or other materials. Second transducer element 12 may be comprised of titanium, stainless steel, aluminum, cold rolled steel, brass or other materials. It is not necessary that both the first and second elements are made of the same material. It is also possible to braze or otherwise secure the second transducer element directly to the wall. For example, as best illustrated in FIG. 10, transducer member 12 may be made of titanium or another metal, and may be brazed directly to the wall. Of course, if the second member is made of a different material than the wall, it is likely that the above-described differences in coefficients of thermal expansion between the second member and the wall will create mating problems. These problems, which have been extensively discussed supra, can be solved by machining a convex shaped surface on the bottom of the second member as shown in FIG. 10. It should be noted further that the second member can be in any number of shapes. For example, the member can be a solid cylinder, a frustoconical shape, etc.

Finally, although not shown in the drawings, in certain applications it is possible to secure the transducer to the wall with epoxy alone (i.e., without brazing or use of a threaded stud)

Although this invention is described by reference to specific preferred embodiments, it is clear that variations can be made without departing from the spirit and scope of the invention as claimed.

What I claim is:

1. An ultrasonic transducer assembly, comprising:

a cobalt base alloy housing having at least one planar wall section;

at least one ultrasonic traducer mounted to said planar wall section, said at least one ultrasonic transducer operatively arranged to impart an ultrasonic vibrating force to said planar wall section;

a first transducer member;

a second transducer member;

a pair of piezoelectric crystals positioned atop one another and sandwiched between said first and second transducer members;

a first electrode electrically connected to said crystals;

a second electrode electrically connected to said crystals, wherein said pair of piezoelectric crystals are operatively arranged to impart an ultrasonic vibrating force to said first and second transducer members when a voltage is applied across said first and second electrodes; and, a stainless steel braze mass operatively arranged to be brazed to said cobalt base alloy housing, said braze mass having a first planar surface to be secured by brazing to said housing and having a second planar surface parallel to said first planar surface, said second planar surface operatively arranged to be secured to said second transducer member, wherein said second planar surface becomes concave in shape after brazing.

2. An ultrasonic transducer assembly as recited in claim 1 wherein said second transducer member has a convex surface operatively arranged to mate with said concave surface of said braze mass after brazing.

3. An ultrasonic transducer assembly as recited in claim 2 further comprising a layer of epoxy between said convex surface of said braze mass and said concave surface of said second transducer member, said epoxy layer functioning to secure and acoustically bond the second transducer member to said braze mass.

4. An ultrasonic transducer assembly as recited in claim 3, further comprising at least one mounting bolt securing said second transducer member to said braze mass.

5. An ultrasonic transducer assembly as recited in claim 1 wherein said first member is comprised of material selected from the group consisting of cold rolled steel, aluminum, brass, stainless steel, titanium, and ceramic.

6. An ultrasonic transducer assembly as recited in claim 1 wherein said second member is comprised of material selected from the group consisting of cold roller steel, aluminum, brass, stainless steel, titanium, and ceramic.

7. An ultrasonic transducer assembly, comprising:

a housing made of a first material having at least one planar wall section;

at least one ultrasonic transducer mounted to said planar wall section, said at least one ultrasonic transducer operatively arranged to impart an ultrasonic vibrating force to said planar wall section, wherein said ultrasonic transducer comprises:

a first transducer member;

a second transducer member;

a pair of piezoelectric crystals positioned atop one another and sandwiched between said first and second transducer members;

a first electrode electrically connected to said crystals;

a second electrode electrically connected to said crystals, wherein said pair of piezoelectric crystals are operatively arranged to impart an ultrasonic vibrating force to said first and second transducer members when a voltage is applied across said first and second electrodes; and, a braze mass made of a dissimilar material with respect to said housing, said braze mass having a first planar surface to be secured by brazing to said housing, and having a second planar surface parallel to said first planar surface, said second planar surface operatively arranged to be secured to said second transducer member, wherein said second planar surface becomes concave in shape after brazing.

8. An ultrasonic transducer assembly as recited in claim 7 wherein said second member is machined to contain a convex shaped surface for mating with said planar wall section of said housing by vacuum brazing.

* * * * *